(12) United States Patent
Han

(10) Patent No.: US 6,957,093 B2
(45) Date of Patent: Oct. 18, 2005

(54) STRUCTURE AND METHOD OF APPLICATION FOR PROTECTING THE SUPERCONDUCTIVITY OF SUPERCONDUCTING COMPOSITES

(75) Inventor: Zhenghe Han, Beijing (CN)

(73) Assignee: Innova Superconductor Technology Co., Ltd., Beijing (CN)

(*) Notice: Subject to any disclaimer, the term of this patent is extended or adjusted under 35 U.S.C. 154(b) by 0 days.

(21) Appl. No.: 10/408,287

(22) Filed: Apr. 7, 2003

(65) Prior Publication Data

US 2004/0023079 A1 Feb. 5, 2004

(30) Foreign Application Priority Data

Apr. 9, 2002 (CN) .......................... 02106058 A

(51) Int. Cl.[7] .......................... H01B 12/00; H01F 6/00; H01L 39/00
(52) U.S. Cl. .......................... 505/231; 505/232; 505/234; 428/930
(58) Field of Search .......................... 505/190, 230, 505/231, 232, 234, 329, 704, 702, 813; 428/693, 699, 701, 702, 930

(56) References Cited

U.S. PATENT DOCUMENTS

| | | | |
|---|---|---|---|
| 5,006,671 A | | 4/1991 | Boeke .......................... 174/125 |
| 5,849,670 A | * | 12/1998 | Nabatame et al. .......... 505/230 |
| 5,869,430 A | | 2/1999 | Mukai et al. ................ 505/230 |
| 6,370,405 B1 | * | 4/2002 | Riley et al. .................. 505/231 |
| 6,469,253 B1 | * | 10/2002 | Saga et al. ................ 174/125.1 |
| 6,552,260 B2 | * | 4/2003 | Fujikami et al. ............ 174/15.4 |
| 6,584,333 B1 | * | 6/2003 | Gauss et al. ................. 505/220 |
| 6,600,939 B1 | * | 7/2003 | Zhao .......................... 505/231 |

FOREIGN PATENT DOCUMENTS

| | | | |
|---|---|---|---|
| JP | 410214713 A | * | 8/1998 |
| WO | WO 99/48115 | * | 9/1999 |
| WO | WO 99/48159 | * | 9/1999 |

OTHER PUBLICATIONS

"Electrical and Mechanical Properties of Bi–2223/Ag/Barrier/Ag Composite Tapes", by P. Kovac et al., *Supercond. Sci. Technol.*, pp. 378–384, (2000).
"Silver–Sheathed Bi–2223 Tapes: The State of the Art", by L. Martini, *Supercond. Sci. Technol.*, pp. 231–237, (1998).
"Superconducting Properties of Multilayered Bi–Pb)–2223/Ag Tapes", by L. Martini et al., *Supercond. Sci. Technol.*, pp. 24–29, (1994).
"About the Possible Observation and Magnetic Characterization of Amorphous Ni", by J.M. Riveiro et al., *Journal of Magnetism and Magnetic Materials*, pp. 153–160, (1998).
*Chinese Journal of Low Temperature Physics*, vol. 21, No. 2, Apr. 1999.
Translation of the relevant sections of *Chinese Journal of Low Temperature Physics*, vol. 21, No. 2, Apr. 1999.

* cited by examiner

Primary Examiner—Stanley S. Silverman
Assistant Examiner—Colleen P. Cooke
(74) Attorney, Agent, or Firm—Westman, Champlin & Kelly, P.A.

(57) ABSTRACT

A structural arrangement of superconducting composites is provided to protect their superconductivity in such a way that these composites are electrically connected in a certain manner. The invention may be practiced with any desired superconducting material, and bismuth based superconducting materials are preferred. The shape and size of the superconducting composites may vary.

13 Claims, 3 Drawing Sheets

--Prior Art--

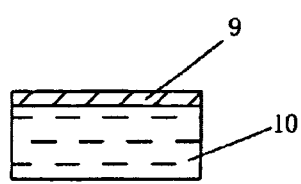
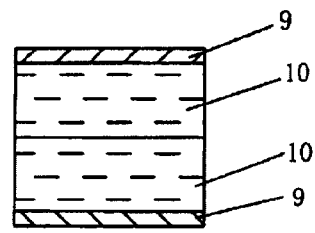
Fig. 8          Fig. 10
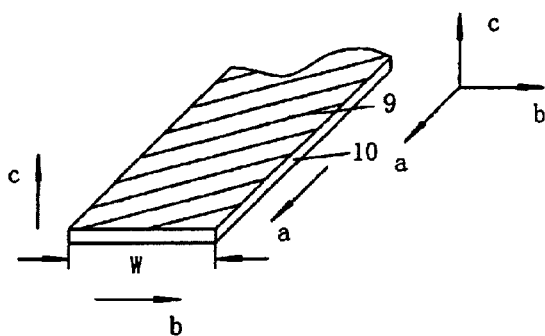
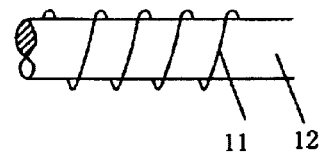
Fig. 9          Fig. 11
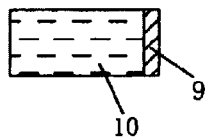
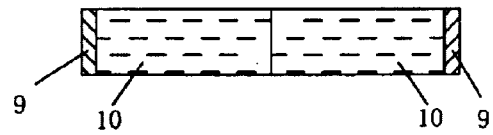
Fig. 12          Fig. 14
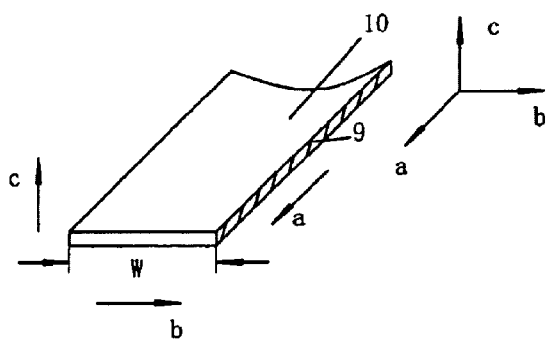
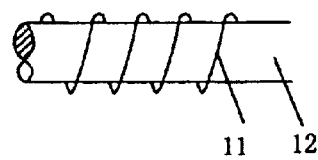
Fig. 13          Fig. 15

STRUCTURE AND METHOD OF APPLICATION FOR PROTECTING THE SUPERCONDUCTIVITY OF SUPERCONDUCTING COMPOSITES

The present application claims priority of Chinese application Ser. No. 02106058.4, filed Apr. 9, 2002, the content of which is hereby incorporated by reference in its entirety.

FIELD OF THE INVENTION

The present invention relates to high temperature superconducting composites using high temperature superconducting materials. More particularly, the invention relates to a method for effectively protecting the superconductivity of high temperature superconducting composites by using a new structural arrangement of these composites.

BACKGROUND OF THE INVENTION

High temperature superconducting materials have been extensively developed over the last few years. They can now be manufactured for use in various devices including cables, transformers, motors and MAGLEV transport vehicles. A Bi-2223 high temperature superconducting (HTS) composite, using Bi-2223 high temperature superconducting material, has become one of the most promising HTS materials as a result of good producibility, and its high electrical and mechanical properties. Currently, the most widely used method for fabricating high temperature superconduting composites is the powder-in-tube (PIT) technique. A composite consists of superconducting filaments surrounded by a matrix of silver and/or silver alloy, to form a multi-filamentary article. Strain introduced in the conducting portion of high temperature superconducting composites during processing, handling and service may result in microcracks in the superconducting grains and even fractures in some of the filaments. Such cracks and fractures may reduce the available superconducting cross-sectional areas that can transport current. In this case, the overall electrical current load will be shared by the remaining filaments. If the current exceeds that which those remaining filaments can carry, the excess current will be transferred into the matrix. Usually the matrix materials are silver and/or silver alloy, which can not withstand large currents, such as 100A, so that the matrix will melt as a result of resistive heating resulting in a so called "burn-out". Consequentially, the high temperature superconducting composites may lapse into a non-superconducting state and the whole superconducting device may fail. This problem may bring difficulties in the practical applications of high temperature superconducting composites. In summary, a special method is necessary to protect the electrical properties of high temperature superconducting composites. By such a method when there are cracks and fractures within the filaments, current may flow through other paths to prevent the burn-out of the composites, hence maintaining the stable operation of superconducting devices.

Up to now, several structural arrangements of high temperature superconducting composites have been provided. A brief summary of some of the advantages and disadvantages of these layouts is given in the following.

(1) Mono-Filamentary Composites

A structure is described by Jan Boeke in U.S. Pat. No. 5,006,671 as shown in FIG. 1, where 1 is a superconductor, 2 is a glass-clad wire. Higher critical current density values have been obtained on superconductor wires having this kind of simple geometry. Moreover, owing to their high filling factor (FF), in the range 0.4<FF<0.5, where FF=[Bi-2223]/([Bi-2223]+[Ag]), large critical current density values correspond also to high engineering current density values. Another form of mono-filamentary composites is the Bi-2223/Ag/barrier/Ag structure provided by P. Kovac et al. (Supercond. Sci. Technol., vol. 13, pp378–384, 2000) shown in FIG. 2, where 1 is a Bi-2223 superconductor, 3 is a barrier layer, and 4 is a silver layer. These composites show reduced ac losses.

Although a mono-filamentary structure has some advantages, it has only a single superconducting region. If the conducting portion of a mono-filamentary high temperature superconducting composite fractures, the overall current will be carried by the silver and silver alloy matrixes surrounded the fracture. The matrix might not withstand the large current, resulting in burn-out. Consequentially, the high temperature superconducting composite may lapse into a non-superconducting state, severely degrading the stability of any superconducting device into which the composite is incorporated.

(2) Multi-Filamentary Composites

A structure investigated by Mukai et al. in U.S. Pat. No. 5,869,430 and Lin Yubao et al. (Chinese journal of low temperature physics, vol.21, No. 2, pp122–130, 1999) is shown in FIG. 3, where 1 is a superconductor, 5 is a noble metal or a noble metal alloy, 6 is a tube aperture into which a superconductor material may be added, and 7 is a silver or silver alloy tube. A high temperature superconducting tape can be made by rolling the above tube, see FIG. 4, where 1 is a superconductor, and 7 is a silver or silver alloy matrix. In a multi-filamentary tape a matrix of noble metal or noble metal alloy encloses each superconducting filament that has a ribbon shape and is substantially uniformly distributed in the cross section of the tape. Compared to mono-filamentary composites, multi-filamentary composites exhibit better mechanical strength, with a higher critical bending strain of >0.3%. However, they have low critical current density values. Another kind of superconducting tape that has a different structure is provided by N. V. Vo et al. (Journal of Magnetic Materials, vol. 188, pp145–152, 1998). The conductor used for coil winding is reduced gradually in size (cross-sectional area) with the outward radial coil distance according to its $I_c$ versus B characteristic curve. This method makes use of the fact that since the magnetic field drops off radially from the center of the coil, thinner wires or tapes can be utilized to carry the same critical current. This method minimizes the use of material, and is cost effective. P. Kov et al. (Supercond. Sci. Technol., vol.13, pp378–384, 2000) also reported a multi-filamentary Bi-2223/Ag/barrier/Ag composite structure, which exhibits similar properties to mono-filamentary composites. These kinds of composites are however of low critical current density and not suited for extensive industrial use.

(3) Concentric Composites

A structure is provided by L. Martini et al. (Supercond. Sci. Technol., vol.11, pp231–237, 1998) shown in FIGS. 5 and 6, where 1 is a superconductor and 7 is a silver or silver alloy sheath. Superconductors are separated by coaxial silver or silver alloy tubes. In FIGS. 5 and 6, one and three superconductor rings are shown respectively. Concentric composites exhibit better electrical and bending properties, similar to those of multi-filamentary tapes ($J_c$>40 kAcm$^{-2}$, $\gamma_c$>0.3%). The silver or silver alloy matrix enhances the thermostability of these composites, and can provide an alternative path for the current, in case of a HTS transition to the normal conducting state. The disadvantage of these composites is the increased ac losses.

(4) Multi-Layered Composites

A structure is provided by L. Martini et al. (Supercond. Sci. Technol., vol.7, pp24–29, 1994) shown in FIG. 7, where 8 is a silver foil, and 1 is a superconducting layer. A pure silver foil, 80–100 μm thick, is folded. The folded silver substrate is then filled with the superconducting powder and the metal-ceramic composite is pressed and heat-treated to form multi-layered tapes with superconducting layers separated by metal layers. Multi-layered composites exhibit a high value of FF, and large critical transport currents, up to $I_c$=300A at 77 K. However, these tapes can only be made in short length of less than 1 m, hence limiting their practical applications.

Based on the above structures and characteristics of high temperature superconducting materials, the following requirements should be met for the structure of high temperature superconducting composites.

(1) Fine

It is usually necessary to bend superconducting composites for practical applications in high temperature superconducting devices. When the composites are bent, it is required that no significant reduction of their critical current density values occurs. The bending strain is equal to h/D according to deformation theory (Z. Han et al., MT-15, Beijing, October, pp20–24, 1997), where h and D are the thickness and bending diameter of a superconducting composite respectively. A critical bending strain, which has been suggested to be about 0.2%, is usually defined as the strain that results in 5% degradation of its critical current. If the bending strain exceeds the critical bending strain value of the material, the current carrying capability will be significantly reduced. A thinner superconducting composite will therefore lead to smaller bending strain under the condition of constant D.

(2) Multi-Filamentary

If one filament, or some filaments, within a multi-filamentary composite fractures, there are other alternative current paths in the composite. Moreover, multi-filamentary composites exhibit better mechanical properties. Typically, the development of performance affecting cracks in response to bending strains is more likely to occur in mono-filamentary composites than in multi-filamentary composites, where the critical bending strain values increase with the number of filaments in the composites, and can be greater than 1.0%. Other limitations of mono-filamentary composites include a poorer crack healing ability and increased oxygen access to the superconductor during processing.

(3) Tape-Shaped

Taped-shaped composites with a thinner thickness may have smaller bending diameters compared to cylindrical composites, and therefore are easier to manufacture into superconducting devices such as coils.

(4) Parallel Connection of Several Composites

When current flows in a filament, it is only carried by the superconductor. When fracture occurs in one or more filaments, the total electrical current will flow through the remaining filaments. If the current exceeds that which those remaining filaments can carry, the excess current will be transferred into the matrix, which might not withstand the large current, resulting in burn-out of the matrix. Consequentially, the high temperature superconducting composite may lapse into a non-superconducting state and the superconducting device into which the composite is incorporated may fail. In the case of parallel connection of several composites, however, the filaments in other composites may provide alternative current paths.

In summary, high temperature superconducting material may be used to fabricate thin multi-filamentary composites with parallel connection among several composites in order to protect against reduction of superconductivity.

SUMMARY OF THE INVENTION

It is a general object of the invention to provide a special structure of superconducting composites to protect against reduction of superconductivity. The invention may be practiced with any desired superconducting material, and bismuth based superconducting materials are preferred. The shape and size of the superconducting composites may vary.

This wire or tape structure may be of six kinds as described in the following:

(1) Parallel Connection on Board Plane

1) The Method of Connection

As shown in FIG. 9, the electrical connecting step is carried out by applying an insulating layer to one of the board planes (ab plane) on each of two superconduting composites, and then co-winding these composites onto a spool with the board plane of one composite on which there is no insulating layer coming face to face with the board plane of the other composite on which there is no insulating layer, see FIGS. 10 and 11. When there are cracks and fractures within the individual filament, current may be diverted to the other filaments protecting the electrical properties of these composites.

2) The method of applying an insulating layer

The step of applying an insulating layer may be carried out by a variety of methods, including first applying an insulating layer to one of the board planes (ab plane) of each of two superconduting composites and then electrically connecting them, or first electrically connecting two superconduting composites and then applying an insulating layer to the exposed board planes (ab plane) of the composites respectively.

3) The number of composites

The number of composites used may vary.

(2) Parallel Connection on Height Plane

1) The method of connection

As shown in FIG. 13, the electrical connecting step is carried out by applying an insulating layer to one of the height planes (ac plane) of each of two superconduting composites, and then co-winding these composites into a coil, with the height plane of one composite on which there is no insulating layer coming face to face with the height plane of the other composite on which there is no insulating layer, see FIGS. 14 and 15. When there are cracks and fractures within the filaments, current may be diverted to the other filaments protecting the electrical properties of these composites.

2) The method of applying an insulating layer

The step of applying an insulating layer may be carried out by a variety of methods, including firstly applying an insulating layer to one of the height planes (ac plane) of each of two superconduting composites and then electrically connecting them, or first electrically connecting two superconduting composites and then applying an insulating layer to the exposed height planes (ac plane) of the composites respectively.

3) The number of composites

The number of composites used may vary.

(3) Parallel Connection by Metal

The composites are connected in parallel using a volume of metal as shown in FIG. 16. This metal may be silver. This method is more suitable for production since there is good electrical contact between two composites, and since the composite connection may break for the first and second described methods.

(4) Parallel Connection by a Conductor

Composites are connected in parallel by conducting materials such as silver glue or carbon glue.

(5) Parallel Connection by Silver Wire

Composites are connected in parallel by silver wires.

(6) Connection in Parallel and Series

Composites may be connected in parallel and series such as by combination of the first and second methods.

BRIEF DESCRIPTION OF THE DRAWINGS

FIG. 8 is a cross-sectional view showing a composite with an insulating layer on its board plane.

FIG. 9 is a perspective view schematically showing a composite with an insulating layer on its board plane.

FIG. 10 is a cross-sectional view showing a combined composite with two multi-filamentary composites connected on their board planes.

FIG. 11 is a schematic illustration showing co-winding of two composites with one board plane of one composite on which there is no insulating layer coming face to face with the board plane of the other composite on which there is no insulating layer, onto a spool to form a coil.

FIG. 12 is a cross-sectional view showing a composite with an insulating layer on its height plane.

FIG. 13 is a perspective view schematically showing a composite with an insulating layer on its height plane FIG. 14 is a cross-sectional view showing a combined composite with two multi-filamentary composites connected on their height plane.

FIG. 15 is a schematic illustration showing co-winding of two composites with one height plane of one composite on which there is no insulating layer coming face to face with the height plane of the other composite on which there is no insulating layer, onto a spool to form a coil.

DETAILED DESCRIPTION OF THE PREFERRED EMBODIMENTS

The invention may be further understood from the following examples:

EXAMPLE 1

An insulating layer was applied to one of the board planes of each of two Bi-2223 high temperature superconducting composites as shown in FIGS. 8 and 9, where 9 was an insulating layer, and 10 was a high temperature superconducting composite. Two composites of 4 mm width and 0.25 mm thickness were electrically connected with the board plane without an insulating layer of one composite coming face to face with the board plane without an insulating layer of the other composite as shown in FIG. 10, where 9 was an insulating layer, and 10 was a superconducting composite. Finally these combined composites were wound onto a spool as shown in FIG. 11, where 11 was the combined composites, and 12 the spool.

EXAMPLE 2

An insulating layer was applied to one of the height planes of each of two Bi-2223 high temperature superconducting composites as shown in FIGS. 12 and 13, where 9 was an insulating layer, and 210 was a high temperature superconducting composite. Two composites of 4 mm width and 0.21 mm thickness were connected with the height plane without an insulating layer of one composite coming face to face with the height plane without an insulating layer of the other composite as shown in FIG. 14, where 9 was an insulating layer, and 10 was a superconducting composite. Finally these combined composites were wound onto a spool shown in FIG. 15, where 11 was the combined composites, and 12 was the spool.

EXAMPLE 3

Figure 1:
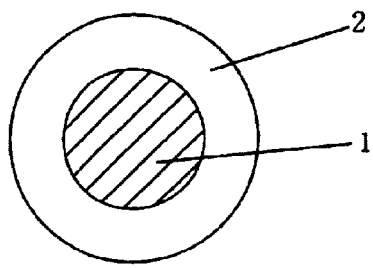
FIG. 1 is a schematic illustration of a mono-filamentary composite.
Figure 2:
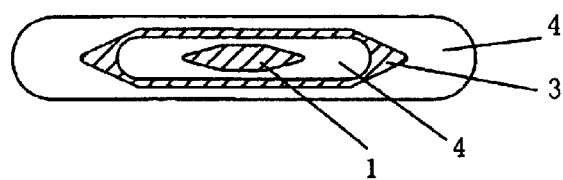
FIG. 2 is a schematic illustration of a mono-filamentary Bi-2223/Ag/barrier/Ag composite.
Figure 3:
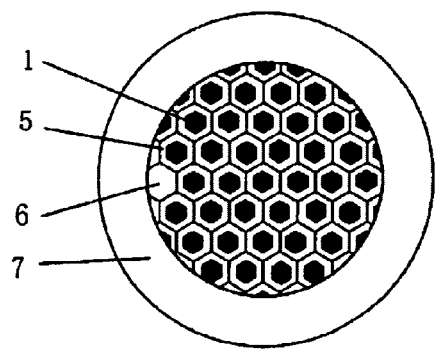
FIG. 3 is a cross-sectional view showing a multi-filamentary composite.
Figure 4:
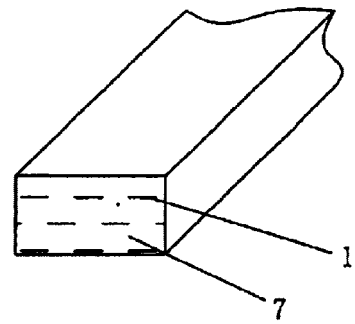
FIG. 4 is a perspective view schematically showing a multi-filamentary composite.
Figure 5:
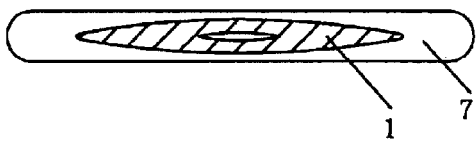
FIG. 5 is a cross-sectional view showing a concentric composite with one HTS flattened ring.
Figure 6:
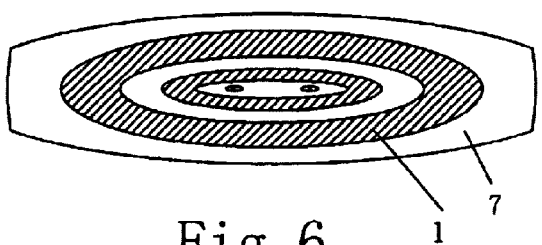
FIG. 6 is a cross-sectional view showing a concentric composite with three HTS flattened rings.
Figure 7:
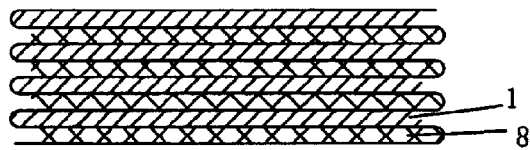
FIG. 7 is a cross-sectional view showing a multi-layered composite.
Figure 16:
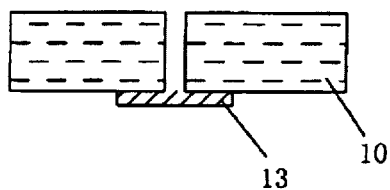
FIG. 16 is a cross-sectional view showing two composites connected by silver.

Two Bi-2223 high temperature superconducting composites of 4.4 mm width and 0.20 mm thickness were connected in parallel by a volume of silver as shown in FIG. 16, where 10 was a high temperature superconducting composite, and 13 was the silver.

EXAMPLE 4

Figure 17:
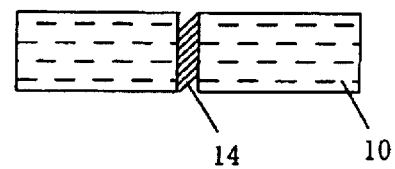
FIG. 17 is a cross-sectional view showing a composite connected by silver glue.

Two Bi-2223 high temperature superconducting composites of 4.4 mm width and 0.20 mm thickness were connected in parallel by silver glue as shown in FIG. 17, where 10 was a high temperature superconducting composite, and 14 was the silver glue.

EXAMPLE 5

Figure 18:
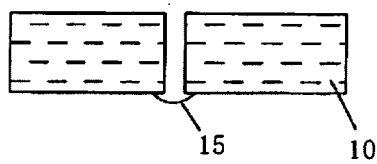
FIG. 18 is a cross-sectional view showing two composites connected by silver wire.

Two Bi-2223 high temperature superconducting composites of 4.4 mm width and 0.20 mm thickness were connected in parallel by a silver wire as shown in FIG. 18, where 10 was a high temperature superconducting composite, and 15 was the silver wire.

EXAMPLE 6

Figure 19:
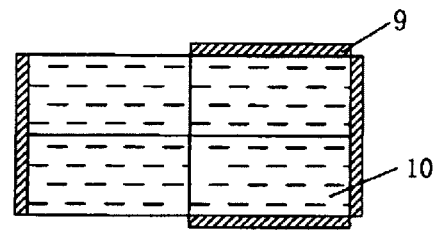
FIG. 19 is a cross-sectional view showing four composites connected in parallel and series.

Four Bi-2223 high temperature superconducting composites of 4.4 mm width and 0.20 mm thickness were connected in parallel and series shown in FIG. 19, in which four composites are coated on one of each of their height planes with an insulating layer and two composites are coated on one of their board planes with an insulating layer.

It will be apparent to those skilled in the art that the methods and advantages of the present invention are capable of being used in production of all multi-filamentary superconductor articles having a variety of compositions and morphologies. The invention is not intended to be limited by any of the particular descriptions and examples set forth above, which are set forth in the specification for purposes of illustration only. The scope and nature of the invention are set forth in the claims.

What is claimed is:

1. A structural arrangement of superconducting composites wherein said structural arrangement comprises at least two superconducting composites, characterized by the superconducting composites being overlapped in the width or thickness dimension, thereby being electrically connected with each other, and by having an insulating layer on their exposed board or height planes.

2. A structural arrangement according to claim 1 wherein a step of applying an insulated layer is carried out prior to electrically connecting the composites, by applying an insulating layer to one of the two board planes of one or no more than two of the constituent superconducting composites.

3. A structural arrangement according to claim 1 wherein an electrically connecting step is carried out by first applying an insulating layer to one of the two board planes of one or no more than two of the constituent superconducting composites, and then co-winding onto a spool these composites such that the board planes of the composites on which there are no insulating layers come face to face with the board planes of the other composites on which there are no insulating layers.

4. A structural arrangement according to claim 1 wherein a step of applying an insulating layer is carried out by first electrically connecting two or more superconducting composites and then applying an insulating layer to the exposed board planes of the group of the composites.

5. A structural arrangement according to claim 4 wherein the electrically connecting step is carried out by first co-winding onto a spool the composites such that the board planes of the composites on which there are no insulating layers come face to face with the board planes of the other composites on which there are no insulating layers.

6. A structural arrangement according to claim 1 wherein a step of applying an insulating layer is carried out prior to electrically connecting them, by applying an insulating layer to one of the two height planes of one or no more than two of the constituent superconducting composites.

7. A structural arrangement according to claim 6 wherein the electrically connecting step is carried out by first applying an insulating layer to one of the two height planes of one or no more than two of the constituent superconducting composites, and then co-winding onto a spool these composites with the height planes of the composites on which there are no insulating layers coming face to face with the height planes of the other composites on which there are no insulating layers.

8. A structural arrangement according to claim 6 wherein the step of applying an insulating layer is carried out by first electrically connecting two superconducting composites and then applying an insulating layer to the exposed height planes of the composites respectively.

9. A structural arrangement according to claim 1 wherein the composites are connected in parallel by metal.

10. A structural arrangement according to claim 9 wherein the metal is silver.

11. A structural arrangement according to claim 1 wherein the composites are connected in parallel by conducting materials.

12. A structural arrangement according to claim 11 wherein the conducting material is silver glue or carbon glue.

13. A structural arrangement according to claim 1 wherein the composites are connected in parallel by silver wire.

* * * * *